United States Patent [19]

Wright et al.

[11] Patent Number: 4,823,130
[45] Date of Patent: Apr. 18, 1989

[54] METHOD AND CONTROL SYSTEM FOR GENERATING A VARIABLE OUTPUT BIT ANALOG TO DIGITAL CONVERTER

[75] Inventors: Danny O. Wright, Newport News; Kregg S. Wiggins, Tabb, both of Va.

[73] Assignee: Siemens-Bendix Automotive Electronics, L.P., Troy, Mich.

[21] Appl. No.: 157,768

[22] Filed: Feb. 18, 1988

[51] Int. Cl.⁴ .............................................. H03M 1/20
[52] U.S. Cl. .................................. 341/157; 341/155; 341/162; 377/70
[58] Field of Search ....... 340/347 AD, 347 M, 347 C; 341/118, 126, 155, 157, 158, 162, 164, 165, 166; 377/44, 70, 74

[56] References Cited

U.S. PATENT DOCUMENTS

| | | | |
|---|---|---|---|
| 4,355,293 | 10/1982 | Driscoll | 338/184 |
| 4,431,985 | 2/1984 | Mott | 340/347 AD |
| 4,733,216 | 3/1988 | Wright | 340/347 AD |

OTHER PUBLICATIONS

The Engineering Staff of Digital Equipment Corporation, Analog-Digital Conversion Handbook, 1964, pp. 20-22.
The Engineering Staff of Analog Devices, Inc., Analog-Digital Conversion Handbook, 6/1972, pp. I-34 and I-35.

Primary Examiner—William M. Shoop, Jr.
Assistant Examiner—Brian Young
Attorney, Agent, or Firm—Russel C. Wells; Markell Seitzman

[57] ABSTRACT

In a digital control system wherein control voltages are analog voltages, a method and control system for generating a variable output bit resolution from an N bit analog to digital converter utilizing a control circuit to control the input spread of the voltage references to the A/D converter. Depending on the binary value of the MSD position, the input reference voltage spread is controlled. If the binary value is zero, the input reference voltage spread is one-half the normal value and the resolution is $N+1$ bits and if the binary value is zero for both the MSD and MSD-1 positions, the input reference voltage spread is one-fourth the normal value and the resolution is $N+2$ bits and so on until the first binary one value is found after consecutive preceding binary zero values.

3 Claims, 2 Drawing Sheets

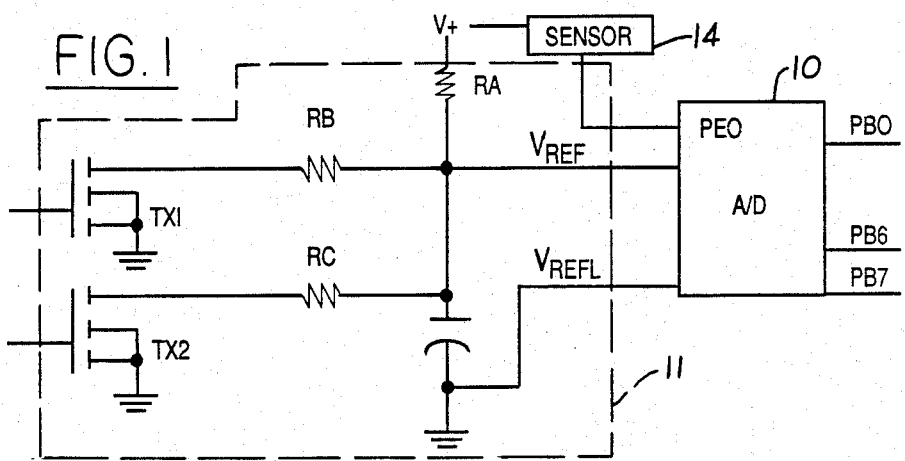
FIG.1
FIG.2
| $V_{REF}$ INPUT | V+ | V+/2 | V+/4 | |
|---|---|---|---|---|
| TX2 | 0 | 0 | 1 | 0 ≡ OFF |
| TX1 | 0 | 1 | 1 | 1 ≡ ON |
| RESOLUTION | N | N+1 | N+2 | |
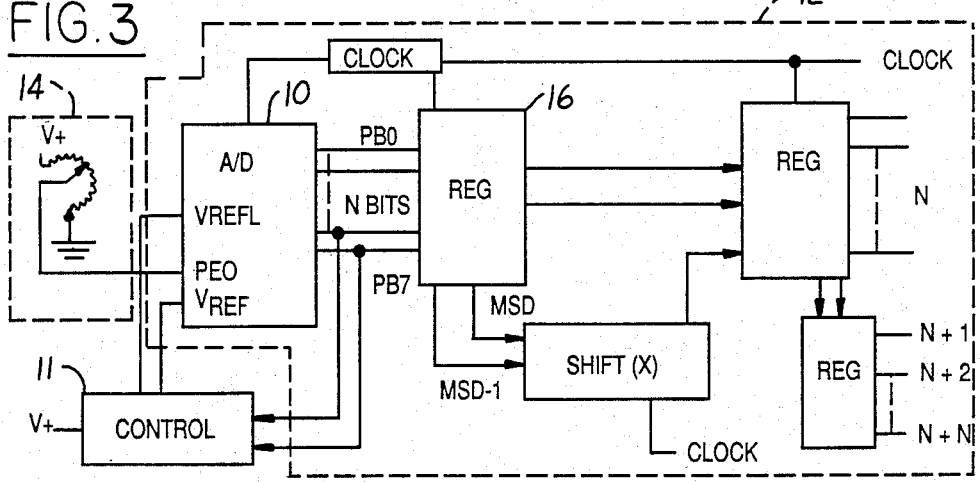
FIG.3

METHOD AND CONTROL SYSTEM FOR GENERATING A VARIABLE OUTPUT BIT ANALOG TO DIGITAL CONVERTER

This invention relates to output bit resolution for an N bit A/D converter and more particularly relates to a method and control system for generating N+1, N+2 or N+X bits of resolution of an analog signal applied to an N bit A/D converter.

CROSS REFERENCED TO RELATED APPLICATIONS

This application is related to U.S. Ser. No. 925,031, filed on Oct. 29, 1986 by D. Wright and entitled "N+1 Bit Resolution from an N Bit A/D Converter".

BACKGROUND OF INVENTION

In certain control applications, a sensor generates an analog signal indicative of the condition being sensed such as fluid level, angular displacement, pressure levels, etc. In order to process the information contained in the signal in modern control systems, it is necessary to convert the analog signal to a digital signal having a certain number of bits of a digital word. The device used is an analog to digital converter, A/D converter.

One input to the A/D converter is, of course the analog signal to be converted. Two other inputs to the A/D converter are for receiving reference voltages which define the range of the input signal. By controlling the reference voltages to the A/D converter, the invention is practiced.

U.S. Pat. No. 4,244,004 issued to Yamada on Jan. 6, 1981, teaches a method of sampling an analog signal to define digitally the signal for use in a picture reproducing machine. Yamada teaches a method wherein digital signals are produced at a certain sampling rate corresponding to an analog signal. The values representative of the analog signal are produced at a frequency which is some multiple "n" of the sampling rate and the digital signal is calculated from "n" consecutively-produced ones of these representative values.

In U.S. Pat. No. 4,558,303 issued to Fielden on Dec. 10, 1985, a method of converting an analog voltage to a digital representation is taught. This is an A/D converter wherein a ramp generator generates a ramping voltage which is summed with the unknown voltage signal and the result is compared with the several outputs of the electronic switching network which is working across the reference voltage range. When there is a comparison, a microprocessor makes the calculations necessary to determine the magnitude of the unknown voltage signal.

SUMMARY OF INVENTION

In one embodiment of the invention, the analog signal is generated from a rotary position sensor which is rotated by the movement of a rotatable member moving through an angular displacement. When the rotatable member, which is the butterfly or throttle plate of an internal combustion engine, is in a first or a substantially horizontal position, the throttle plate closes the air input to the engine. As the throttle plate is rotated in an opening direction, the amount of air ingested to the engine increased rapidly. It is desired to accurately measure such small angular rotations for accurate engine control. However when the throttle valve approaches a wide open position, the accuracy of the measurement of the angular position is not as critical.

It is therefore a principle advantage of the preferred embodiment of the present A/D conversion system to provide a very high resolution in the angular movement of a rotatable member through a first angular movement range, a high resolution of the angular movement of a rotatable member moving through a second angular movement range and a standard resolution of the angular movement of a rotatable member moving through a third angular movement range. In the present embodiment, the angular ranges are 0–22.5°, 22.5°–45°, and over 45° respectively.

In its broadest form, there is disclosed a method for generating a variable output bit resolution from an N bit analog to digital converter. The method has as its first step reading the analog voltage to be converted. The voltage to be converted is supplied to an analog to digital converter wherein the analog voltage is converted into an N bit digital word. The most significant bit position of the N bit digital word is tested for a binary zero value and if the value is zero the binary value of the penultimate most significant bit position is tested for a binary zero value and so on with each preceding consecutive significant bit position until a binary one value is found. The method then responds to the last consecutive binary zero value prior to the binary one value for shifting the input voltage reference to the analog to digital converter to a value equal to $2^{-X}$ its original value, wherein X equals the number of consecutive binary zero bit positions starting from the most significant bit position and proceeding consecutively toward the least significant bit position. Another analog to digital conversion is then done with the new voltage reference which will then yield an output of an N+X bit word.

Many other objects and purposes of the invention will be clear from the following detailed description of the drawings.

BRIEF DESCRIPTION OF THE DRAWINGS

In the drawings:

FIG. 1 is a circuit schematic of the reference voltage control.

FIG. 2 is a state table of the amplifiers of FIG. 1.

FIG. 3 is a block diagram of the system for implementing the resolution control.

DETAILED DESCRIPTION

Figure 4:
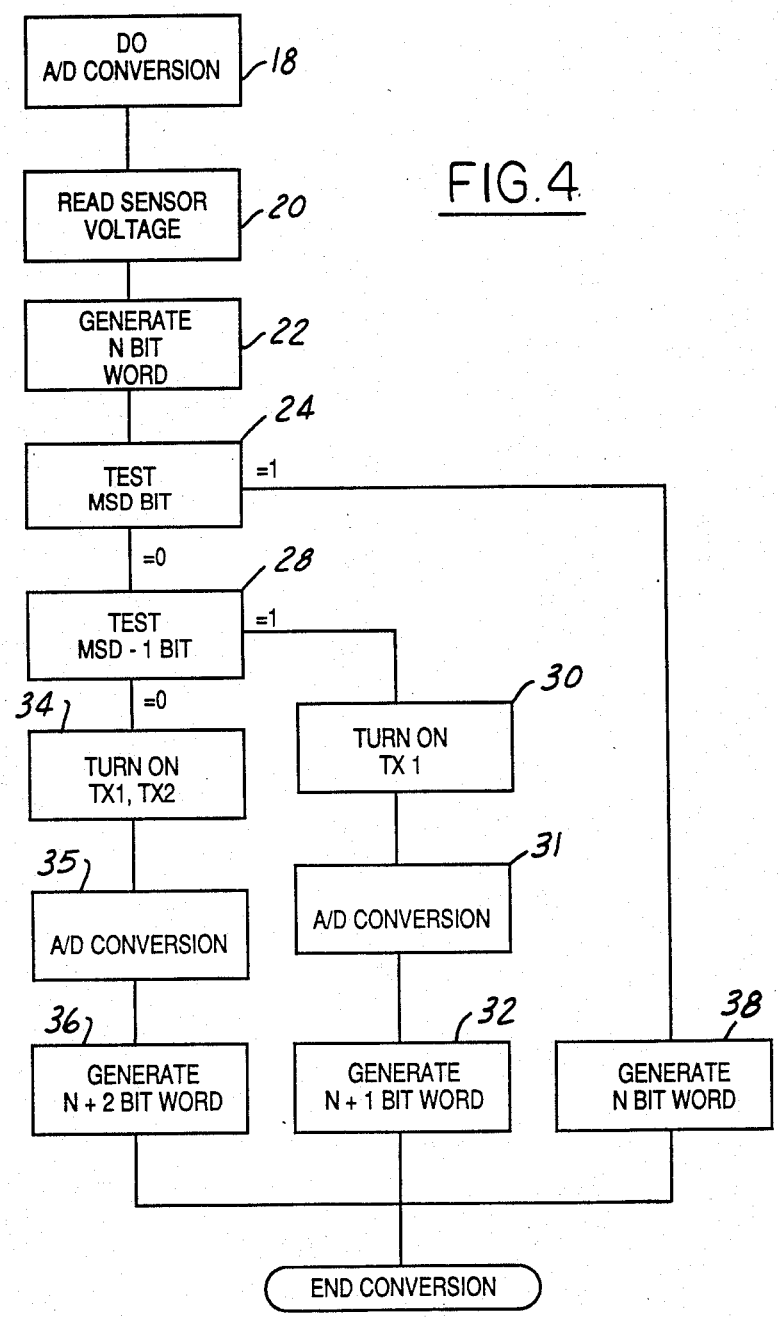
FIG. 4 is a flow chart of the method of implementing the resolution control.

In its broadest form, there is disclosed a method for generating a variable output bit resolution from an N bit analog to digital converter. The method has as its first step reading the analog voltage to be converted. The voltage to be converted is supplied to an analog to digital converter wherein the analog voltage is converted into an N bit digital word. The most significant bit position of the N bit digital word is tested for a binary zero value and if the value is zero the binary value of the penultimate most significant bit position is tested for a binary zero value and so on with each preceding consecutive significant bit position until a binary one value is found. The method then responds to the last consecutive binary zero value prior to the binary one value for shifting the input voltage reference to the analog to digital converter to a value equal to $2^{-X}$ its original value, wherein X equals the number of consecutive binary zero bit positions starting from the most significant bit position and proceeding consecutively toward the least significant bit position. Another analog to digital conversion is then done with the new voltage reference which will then yield an output of an N+X bit word.

Referring to FIG. 1, there is illustrated in schematic form the control system 11 for applying the reference voltage $V_{REF}$ to an A/D converter 10. In the preferred embodiment, the A/D converter 10 is contained within a Microprocessor Unit 12, MPU, such as Motorola's MC68HC11A8 wherein the input pins are labelled PE0-PE7 identifying that the input is Port E. The sensor 14 input is shown connected to one of the inputs of the A/D converter 10 such as PE0. The other inputs are $V_{REF}$ and $V_{REFL}$ and the outputs are N bit word lines labelled PB0-PB7 which indicate that N=8.

Resolution accuracy is accomplished by changing the reference voltage limits. In the particular embodiment, the upper or higher voltage limit $V_{REF}$ is changed as the lower voltage limit $V_{REFL}$ is maintained at ground voltage potential. By the action of the control system 11, the reference voltage is obtained by dividing the previous reference voltage by the value of two. Thus the initial voltage of $V_{REF}$ is V+, and the resolution may be characterized as a standard resolution which is N bits. If the reference voltage $V_{REF}$ is V+/2 then the resolution may be characterized as a high resolution which is N+1 bits and if the reference voltage is V+/4 then the resolution may be characterized as a very high resolution which is N+2 bits.

In general, the control system responds to a binary zero bit value in each consecutive bit position starting from the most significant bit position to the most significant minus X bit positions for generating a pair of voltage references to the voltage reference ports. The pair of voltage references have a voltage spread wherein the upper voltage level is:

$$V_{REF\ new} = (2^{-X}) V_{REF\ original}$$

for generating N+X bit resolution from the N bit analog to digital converter 10.

If $V_{REF}$ is V+, then transistors TX1 and TX2 are non-conducting or OFF. This applies V+ to the $V_{REF}$ input through the resistor $R_A$. In the preferred embodiment, V+ =5 volts and the signal range from the sensor 14 is accepted to be from 0 to 5 volts.

If $V_{REF}$ is V+/2, then transistor TX1 is conducting or ON and TX2 is non-conducting. This applies V+ to the $V_{REF}$ input through the series circuit of $R_A$ and $R_B$. In the preferred embodiment, V+ =5 volts and the signal range from the sensor 14 is accepted to be from 0 to 2.5 volts.

Continuing, if $V_{REF}$ is V+/4, then both transistors TX1 and TX2 are conducting and the voltage V+ is applied through the series parallel circuit of $R_A$ in series with the parallel combination of $R_B$ and $R_C$. In the preferred embodiment, V+ =5 volts and the signal range from the sensor 14 is accepted to be from 0 to 1.25 volts.

As indicated, in the preferred embodiment, the voltage input $V_{REFL}$ is ground potential. It is to be understood that if the very high resolution was to be performed about the higher voltage limits of the sensor 14, the voltage $V_{REFL}$ would be raised to V+/2 and 3V/4 and the hook-up of the transistors TX1 and TX2 would be such to accomplish the appropriate voltage division which is well known to those skilled in the art in accordance with the preceding teaching. In which case, the general form of the voltage is $$V_{REFL\ new} = (1 - 2^{-X}) V+$$

for N+X bits of resolution.

Referring to FIG. 2, there is shown the state table for the circuit of FIG. 1. The state table has as its controlling inputs, the status of TX1 and TX2. If TX1 and TX2 are OFF, the resolution is standard or N bit. If TX1 is ON and TX2 is OFF, the resolution is high or N+1 bit and if both TX1 and TX2 are ON, then the resolution is very high or N+2 bit.

Referring to FIGS. 3 and 4, the operation of the system will be explained. All conversions begin as an N bit conversion in the first step 18. The output of the sensor 14 is read in step 20 to the A/D converter 10 with the voltage range from 0-5 volts and an N bit digital word is generated in step 22. After the conversion is completed, the output of the A/D converter 10 is placed in a register 16 in the MPU 12. The MSD position is tested in the following step 24. If the MSD position has a value of binary zero in step 24, the MSD-1 bit position is tested in step 28.

As a result of this testing if MSD is equal to binary zero and MSD-1 is equal to binary one, the transistor TX1 is turned on in step 30, an analog to digital conversion is done in step 31 and an N+1 bit word is generated in step 32. If the MSD and MSD-1 are both equal to binary zero, both transistors TX1 and TX2 are turned on in step 34, an analog to digital conversion is done in step 35 and an N+2 bit word is generated in step 36. If the MSD bit position is a binary one, then in step 38 an N bit word is generated.

If the MSD position has a value of binary zero in step 24, the MPU 12 causes the value of the register 16 to be multiplied or shifted by a factor of two or four depending upon the value of the MSD-1 position. If the multiplication is by four, the resolution is ten bits and if by two the resolution is nine bits.

In the preferred embodiment, the sensor is the sensor illustrated in U.S. Pat. No. 4,355,293 issued on Oct. 19, 1982 to Driscoll and assigned to a common assignee. The sensor is connected to the accelerator pedal of a motor vehicle and measures the angle of rotation of the accelerator to determine the response of the vehicle operator and modify throttle valve operation.

The output analog signal is converted as herein explained and the digital output word is supplied to a pair of D/A converters for converting signal into either sine or cosine functions for application to a d.c. stepper motor. This is explained in the copending patent application entitled "Microstepping of an Unipolar D.C. Motor" cofiled herewith and incorporated herein by reference.

Another application of the system herein is to measure the actual angular position of the throttle valve with the desired angular position. This involves a pair of sensors as previously described wherein the analog outputs of the sensors are supplied to the A/D converter at, for instance input pins PE0 and PE1 respectively of the MPU, and the digital words are compared in the MPU. The resultant error signal, that is the signal indicating that the actual angular position is not equal to the desired angular position is then supplied to the d.c. stepper motor as described in the copending patent application.

In such an application, if the MSD and MSD-1 bit positions are equal to binary one, the angular position is between 45° and 90°. If the MSD and MSD-1 bit positions are equal to binary zeros the angular position is between 0° and 22.5° and if the MSD bit position is equal to binary zero and the MSD-1 bit position is equal to binary one the angular position of the throttle blade is between 22.5° and 45°. From this it is recognized that as the angle gets smaller, the amount of air ingested into the engine is more critical and the resolution of the angle of the throttle blade becomes higher.

Many changes and modifications in the above described embodiment of the invention can, of course, be carried out without departing from the scope thereof. Accordingly, that scope is intended to be limited only by the scope of the appended claims.

I claim:

1. A method for generating a variable output bit resolution from an N bit analog to digital converter comprising the steps of:

reading the analog voltage to be converted;

converting a first time in an analog to digital converter said analog voltage into an N bit digital word;

testing the most significant bit position of the N bit digital word for a binary zero value;

responding to a binary zero value in said most significant bit position for testing the binary value of each preceding consecutive significant bit position for a binary zero value until the first binary one value;

responding to said binary one value for shifting the high input voltage reference to said analog to digital converter to a value equal to $2^{-X}$ its original value, wherein X equals the number of consecutive zero bit positions starting from the most significant bit position and proceeding toward the least significant bit position until said first binary one value; and then converting a second and final time in an analog to digital converter said analog voltage into an $N+X$ bit digital word.

2. A control system for generating a variable output bit resolution from an N bit analog to digital converter comprising:

means for generating an analog signal;

means for generating a first pair of voltage references $V_{REF}$ and $V_{REFL}$;

an N bit analog to digital converter having at least one input port for receiving said analog signal, at least two voltage reference ports for receiving said voltage references, and N output ports for generating an N bit digital word from said analog signal;

means responsive to consecutive binary zero bit values preceding from the most significant bit position of said N bit digital word for generating said pair of voltage references to said voltage reference ports, wherein said pair of voltage references has a voltage spread wherein the new upper voltage level is:

$$V_{REF\ new} = (2^{-X}) V_{REF\ original}$$

and the lower voltage level $V_{REFL}$ is zero voltage level for generating $N+X$ bit resolution from said N bit analog to digital converter wherein X equals the number of consecutive binary zero bit values in said N bit digital word and means for converting said analog signal with said new upper voltage level to generate a digital output signal having a resolution equal to the basic number of bits of the converter plus additional bits equal to the number of consecutive binary zero bit values.

3. In the control system according to claim 2 additionally including means responsive to consecutive binary one bit values from the most significant bit position for generating a pair of voltage references to said voltage reference ports, wherein said new pair of voltage references having a voltage spread wherein the new lower voltage level is:

$$V_{REFL\ new} = (1 - 2^{-X}) V_{REFL\ original}$$

and the upper voltage level $V_{REFH}$ is the original voltage level for generating $N+X$ bit resolution from said N bit analog to digital converter.

* * * * *